United States Patent [19]

Majewski et al.

[11] Patent Number: 5,716,909
[45] Date of Patent: Feb. 10, 1998

[54] PROCESS FOR INCREASING THE PINNING FORCE OF SUPERCONDUCTING BI-SR-CA-CU-O CERAMIC MOLDINGS

[75] Inventors: Peter Majewski, Rudersberg; Guenter Petzow, Leinfelden-Echterdingen; Fritz Aldinger, Stuttgart; Bernhard Hettich, Eppstein/Taunus; Steffen Elschner, Niedernhausen, all of Germany

[73] Assignee: Hoechst Aktiengesellschaft, Frankfurt am Main, Germany

[21] Appl. No.: 724,426

[22] Filed: Oct. 1, 1996

Related U.S. Application Data

[63] Continuation of Ser. No. 429,004, Apr. 26, 1995, abandoned, which is a continuation of Ser. No. 164,486, Dec. 10, 1993, abandoned.

Foreign Application Priority Data

Dec. 12, 1992 [DE] Germany .................... 42 41 998.0

[51] Int. Cl.$^6$ .................................. H01L 39/24
[52] U.S. Cl. .................. 505/501; 505/450; 505/121; 505/739; 505/742; 505/782; 505/733; 505/430; 427/62
[58] Field of Search .................... 505/450, 430, 505/501, 121, 733, 739, 742, 782, 320; 427/62

[56] References Cited

U.S. PATENT DOCUMENTS 5,114,909  5/1992  Shi .................................. 505/1
5,192,739  3/1993  Lay .

FOREIGN PATENT DOCUMENTS

90/04568  5/1990  WIPO .

OTHER PUBLICATIONS

Advanced Materials, "Materials Science From VCH", vol. 4, No. 7/8, pp. 508–511, (1992).

Kase et al, Jpn. J. Appl. Phys. 29(7) Jul. 1990, pp. L1096–L1099.

Spann et al, J. Mater. Res., vol. 5, No. 6, Jun. 1990 pp. 1163–1168.

Vengalis et al, Physica C197 (1992) pp. 64–68.

Nogi et al, Supercond. Sci. Technol. 5 (1992) pp. 269–274.

Sekine et al, "Comparison of Bi–system 2223 and 2212 Thick Superconducting Tapes: Grain Alignment, Current Density, and Strain Effects", J. Appl. Phys. 70(3), Aug. 1991, pp. 1596–1599.

*Primary Examiner*—Roy V. King
*Attorney, Agent, or Firm*—Foley & Lardner

[57] ABSTRACT

Process for increasing the pinning force of superconducting Bi-Sr-Ca-Cu-O ceramic moldings, which comprises heating the pure-phase 2212 phase of a Bi-Sr-Ca-Cu-O ceramic molding under pure oxygen or an oxygen-containing gas for from 1 to 40 minutes to a temperature of from 825° to 900° C. and generating secondary-phase precipitates in the process.

20 Claims, 5 Drawing Sheets

$Bi_xSr_2CaCu_2O_{8+d}$

PROCESS FOR INCREASING THE PINNING FORCE OF SUPERCONDUCTING BI-SR-CA-CU-O CERAMIC MOLDINGS

This application is a continuation of application Ser. No. 08/429,004, filed Apr. 26, 1995, now abandoned which is a continuation of Ser. No. 08/164,486, filed Dec. 10, 1993, now abandoned.

BACKGROUND OF THE INVENTION

The industrial application of ceramic Bi-Sr-Ca-Cu-O superconductors, e.g. in the form of rods or wires having a multifilament structure, is at present still quite restricted, because the high-temperature superconductors at 77K. in an applied magnetic field are so far able to carry only small electrical currents. This effect results from flux jumping and flux creep of the so-called quantized magnetic flux lines in these materials. Industrial application of superconducting ceramics in a magnetic field therefore requires that flux jumping and flux creep be largely restricted or entirely eliminated by means of suitable stabilization measures (pinning). The critical current densities in the magnetic field can be made many times greater by introducing pinning centers in ceramic superconductors. Defects such as, e.g. normally conducting clusters, precipitations and secondary-phase precipitates, incorporated in a controlled manner, in the superconducting material constitute suitable pinning centers.

For the purpose of practical applications, a superconductor of this type is operated at a temperature $T<T_c$ and an external magnetic field $H_{c1}<H_a<H_{c2}$. In principle, in this state a material is present in which two physical states exist, namely, on the one hand, the superconducting matrix carrying the supercurrent and, on the other hand, normally conducting domains through which the magnetic field lines of the external magnetic field are running. The superconducting matrix is permeated by said normally conducting domains whose number increases with magnetic field strength. The normally conducting domains are moved through the superconducting matrix as a result of the classical Lorenz force ($I_{super}$* $H_{external}=F_{Lorenz}$). This movement consumes energy which is extracted from the supercurrent. The so-called pinning centers constitute potential energy walls for said moving quantized flux lines. The height of the potential wells depends on their nature but also on the operating temperature of the superconductor and the field strength of the magnetic field.

The basis for the development of a process to enhance the pinning properties of ceramic Bi-Sr-Ca-Cu-O superconductors is formed by the knowledge of the phase equilibria in the system $Bi_2O_3$-SrO-CaO-CuO, especially of the extent of the homogeneity range of the superconducting compound $Bi_{2+x}(Sr,Ca)_3Cu_2O_{8+d}$ (2212 phase, $T_c \leq 94$ K.) as a function of the temperature (FIG. 1).

SUMMARY OF THE INVENTION

We have found that it is possible, by selecting suitable initial compositions and annealing temperatures, to generate secondary-phase precipitates in nearly pure-phase ceramics of the 2212 phase, which precipitates can enhance the pinning properties of the said ceramics.

The object therefore relates to a process for increasing the pinning force of superconducting Bi-Sr-Ca-Cu-O ceramic moldings, which comprises heating the pure-phase 2212 phase of a Bi-Sr-Ca-Cu-O ceramic molding under pure oxygen or an oxygen-containing gas for from 1 to 40 minutes to a temperature of from 825° to 900° C.

DESCRIPTION OF PREFERRED EMBODIMENTS

The pure-phase 2212 phase in the system Bi-Sr-Ca-Cu-O is described in detail in Advanced Materials, 1992, pp. 508–511, which is expressly incorporated by reference. The range within which the 2212 phase is thermally stable depends on the temperature. Thus, said 2212 phase can, for example, be defined as follows for a temperature of 820° C.: $2.05/0.95 \leq Sr/Ca \leq 1.2/1.8$; Bi content from 2.1 to 2.3; Cu content 2. According to the invention, the pinning force of said 2212 phase is increased by moldings comprising this phase being heated under oxygen or under an oxygen-containing atmosphere, preferably air, to a temperature within the specified temperature range. The annealing time in this process is from 1 to 40 minutes. The annealing temperature should be chosen in such a way that a temperature is attained in which the pure 2212 phase is no longer present, and instead a multi-phase system is obtained which, in addition to the pure 2212 phase, contains one or more other phases. In this way, the formation of secondary-phase precipitates is achieved, which ensure the desired increase of the pinning force. Preferably, the following conditions are employed: from 880° to 895° C. for approximately 30 minutes in air or in pure oxygen, the Bi content of the 2212 phase being 2.18 and the Sr/Ca ratio being from 1.7/1.3 to 1.9/1.1; from 885° to 895° C. for approximately 30 minutes in pure oxygen, the Bi content of the 2212 phase being 2.18 and the Sr/Ca ratio being from 2.2/0.8 to 2.3/0.7; from 870° to 880° C. for approximately 30 minutes in air, the Bi content of the 2212 phase being 2.3 and the Sr/Ca ratio of ⅔. The conditions described will be explained herein in more detail with reference to FIG. 1 and FIG. 1a (cf. the corresponding FIG. 2 in Advanced Materials, 1992, p. 509). In said FIG. 1, the numbers I to VII designate the following phases:

I: pure 2212 phase;
II: 2212 phase+$Sr_{14}Cu_{24}O_{41-x}$+$(Sr,Ca)_3Bi_2O_6$+Raveau phase;
III: 2212 phase+$Ca_2CuO_3$+y phase;
IV: 2212 phase+$Ca_2CuO_3$+melt;
V: 2212 phase+$(Sr,Ca)CuO_2$+$(Sr,Ca)_3Bi_2O_6$+melt;
VI: melt+$(Sr,Ca)CuO_2$+$Cu_2O$+$O_2$;
VII: melt+$Ca_2CuO_3$+$Cu_2O$+$O_2$.

Figure 1:
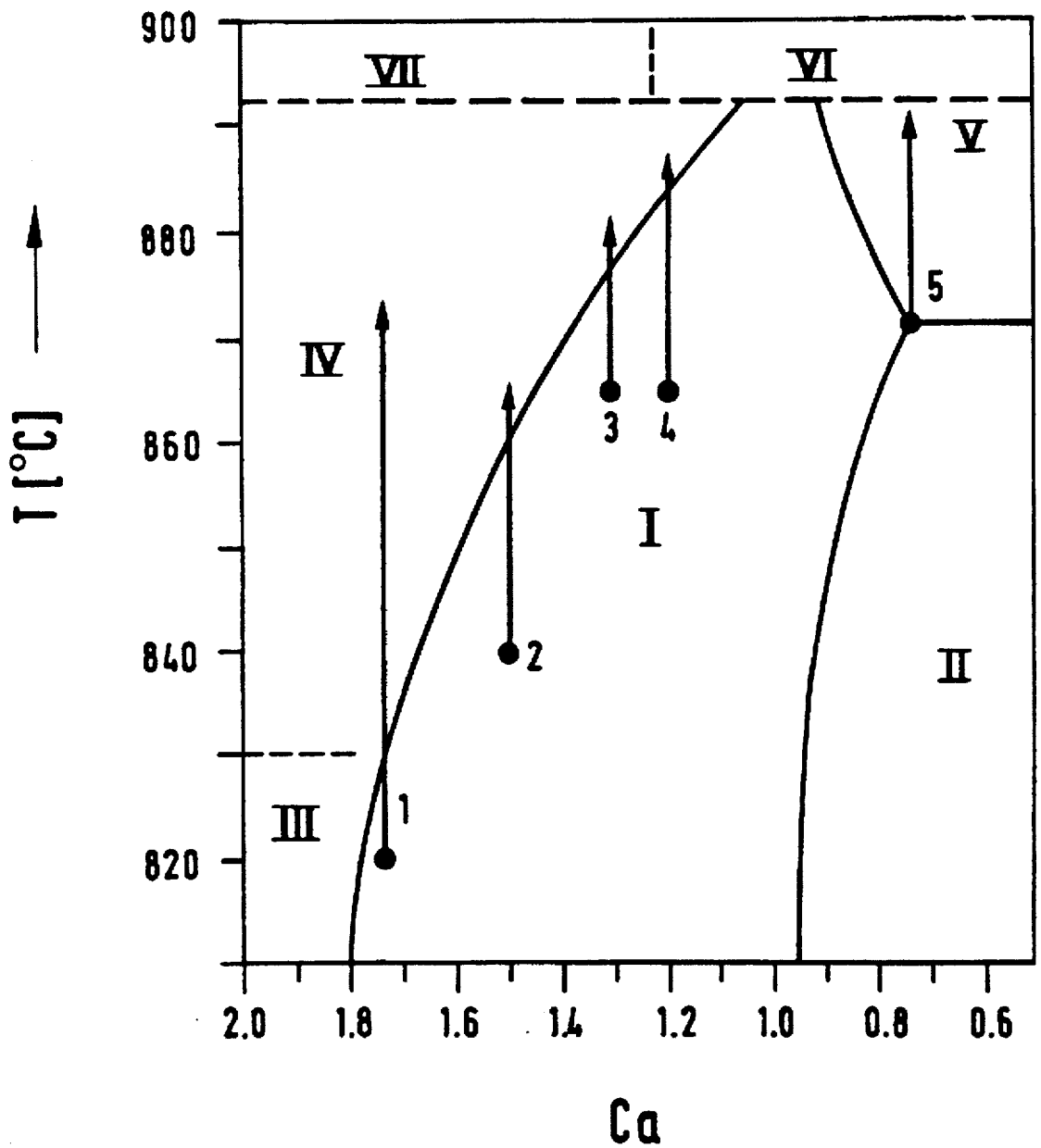
FIG. 1 is a phase diagram for $Bi_{2-x}(Sr,Ca)_3Cu_2O_{8+d}$ as a function of the temperature.
Figure 1A:
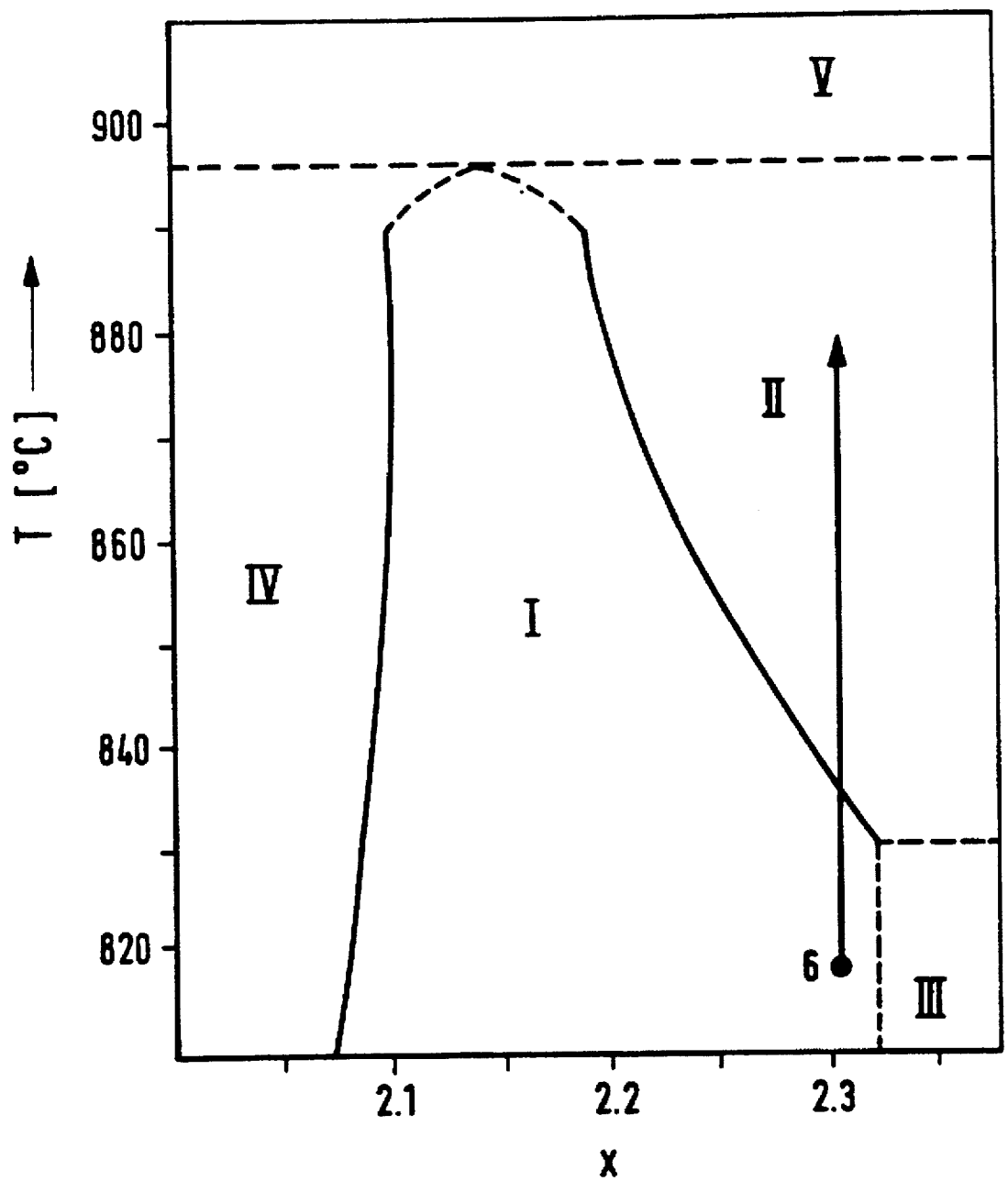
FIG. 1a is a phase diagram for $Bi_xSr_2CaCu_2O_{8+d}$ as a function of the temperature.

In said FIG. 1a, the numbers I to V designate the following phases:

I: pure 2212 phase;
II: 2212 phase+melt;
III: 2212 phase+Rayeau phase;
IV: 2212 phase+$Sr_{14}Cu_{24}O_{41-x}$+$(Sr,Ca)_3Bi_2O_6$+$Ca_2CuO_3$;

V: melt+Raveau phase.

The numbers 1 through 5 and 6 entered within the 2212 phase in FIG. 1 and FIG. 1a indicate the composition of six different batches within the 2212 phase, and the associated arrows show to which temperature the respective batches are heated. The domain aimed for by heating (annealing) said batches was one in which, in addition to the pure 2212 phase, further phases exist which form the secondary precipitates which in turn are responsible for the increase in the pinning force.

EXAMPLES

Batches of various compositions were prepared both powder-metallurgically and according to the melt-casting process. The batches have the compositions:

1) $Bi_{2.18}Sr1.25Ca1.75Cu_2O_x$
2) $Bi_{2.18}Sr1.5Ca1.5Cu_2O_x$
3) $Bi_{2.18}Sr1.7Ca1.3Cu_2O_x$
4) $Bi_{2.18}Sr1.8Ca1.2Cu_2O_x$
5) $Bi_{2.18}Sr2.25Ca0.75Cu_2O_x$
6) $Bi_{2.3}Sr_2CaCu_2O_x$

Batches 1, 2, 5 and 6 were prepared powder-metallurgically. The batches were calcined at 750° C. for 36 hours and thereafter at 790° C. for 24 hours. Prior to the pressing of the green bodies, the powders were homogenized in a porcelain mortar. The green bodies were sintered at 820° C. for 60 hours (batches 1 and 6), at 840° C. for 60 hours (batch 2) and at 870° C. for 60 hours (batch 5).

Batches 3 and 4 were prepared according to the melt-casting method. This was followed by sintering the melt castings again at 865° C. for 60 hours.

The six batches are almost pure-phase. The sintered bodies of batch 1 contain $Ca_2CuO_3$ as a secondary phase (approximately 1% by volume). The sintered bodies of batches 2, 5 and 6 contain no secondary phases. The sintered bodies of batches 3 and 4 contain CuO as a secondary phase (approximately 5% by volume). The chemical composition of the 2212 phase was determined with the aid of electron beam microanalysis. This gave the following chemical compositions of said phase:

Batch 1: $Bi_{2.18}Sr1.25–1.2Ca1.75–1.8Cu_2O_x$
Batch 2: $Bi_{2.18}Sr1.5–1.55Ca1.5–1.45Cu_2O_x$
Batch 3: $Bi_{2.18}Sr1.7–1.75Ca1.3–1.25Cu_2O_x$
Batch 4: $Bi_{2.18}Sr_{1.8}Ca1.2Cu_2O_x$
Batch 5: $Bi_{2.18}Sr_{2.27}Ca0.73Cu_2O_x$
Batch 6: $Bi_{2.28}Sr_2CaCu_2O_x$ The sintered bodies of batch 1 were then annealed at 875° C. for 5, 10, 20 and 30 minutes. The sintered bodies of batch 2 were annealed at 865° C. for 15, 30, 45 and 60 minutes. The sintered bodies of batch 3 were annealed at 880° C. for 5, 15, 30 and 60 minutes. The sintered bodies of batch 4 were annealed at 887° C. for 15, 30, 45 and 60 minutes. The sintered bodies of batch 5 were annealed at 885° C. and 895° C. for 15, 30, 45 and 60 minutes and at 850° C. for 24, 48 and 70 hours. The sintered bodies of batch 6 were annealed at 880° C. for 15, 30, 45 and 60 minutes. The individual samples of each batch did not exhibit any changes in their geometry.

Annealing was carried out in air. After annealing, the samples were quenched in air on a copper slab (approximately 10 mm thick). The quenching rate is approximately 100K. per second for the temperature interval from the annealing temperature to 600° C., and approximately 10K. per second for the temperature interval from 600° C. to room temperature.

The microstructures of the samples were studied with the aid of an electron microscope and of a direct-light microscope, using polarized light. In doing so it was found, surprisingly, that after as little as 15 minutes, secondary-phase precipitates had formed in the samples. Electron beam microanalyses of the secondary-phase precipitates in the samples of batch 3 gave $Ca_2CuO_3$ in the form of black, lenticulate crystals. Likewise, $(Sr,Ca)_{14}Cu_{24}O_{41-x}$, $(Sr,Ca)CuO_2$ and $(Sr,Ca)_3Bi_2O_6$ in the samples of batch 5, the melt in the samples of batch 6 and the various chemical compositions of the 2212 phase could be identified before and after the annealing stages in each case with the aid of electron beam microanalysis.

In the case of the samples of batch 5, which were annealed at 850° C. for 24, 48 and 70 hours, corresponding findings could not be obtained until an annealing time of 70 hours. As the annealing time increases, both the proportion and the maximum size of the precipitations increases.

The quality of the pinning centers in the samples thus treated was determined in the following manner:

At a constant temperature $(T<T_c)$ the superconducting sample is exposed to an external magnetic field in order to induce a supercurrent. What is then measured, is the magnetization of the sample as the external magnetic field is increased, the sign of the external magnetic field being changed twice. The pinning centers present in the sample are responsible for the facts that, in spite of an opposed external magnetic field, there still remains in the interior of the sample a magnetic flux in the original direction (prior to the reversal of the magnetic field) and that the magnetization curve shows pronounced hysteresis. The differentiation of the magnetization ΔM is proportional to the pinning force with which an ensemble of pinning centers opposes the movement of the quantized flux lines. An alternative comparable measure for the pinning force of a sample is therefore given by the quotient $F=[\Delta M_{300\ Gauss}]/[\Delta M_{20,000\ Gauss}]$. An additional advantage of using this quotient is the concomitant standardization of sample-specific parameters (density, geometry).

The following holds good for F:

F=1: ideal pinning, no effect of the external magnetic field on the superconductor at 20,000 Gauss.

F→∞: no pinning.

The measurements of the hysteresis of the magnetization of the samples of batches 1, 2, 3, 4 and 6 at 5 Kelvin and 30 Kelvin show that the magnetization of the individual samples of each charge is a function of the annealing time of the final annealing.

Figure 2:
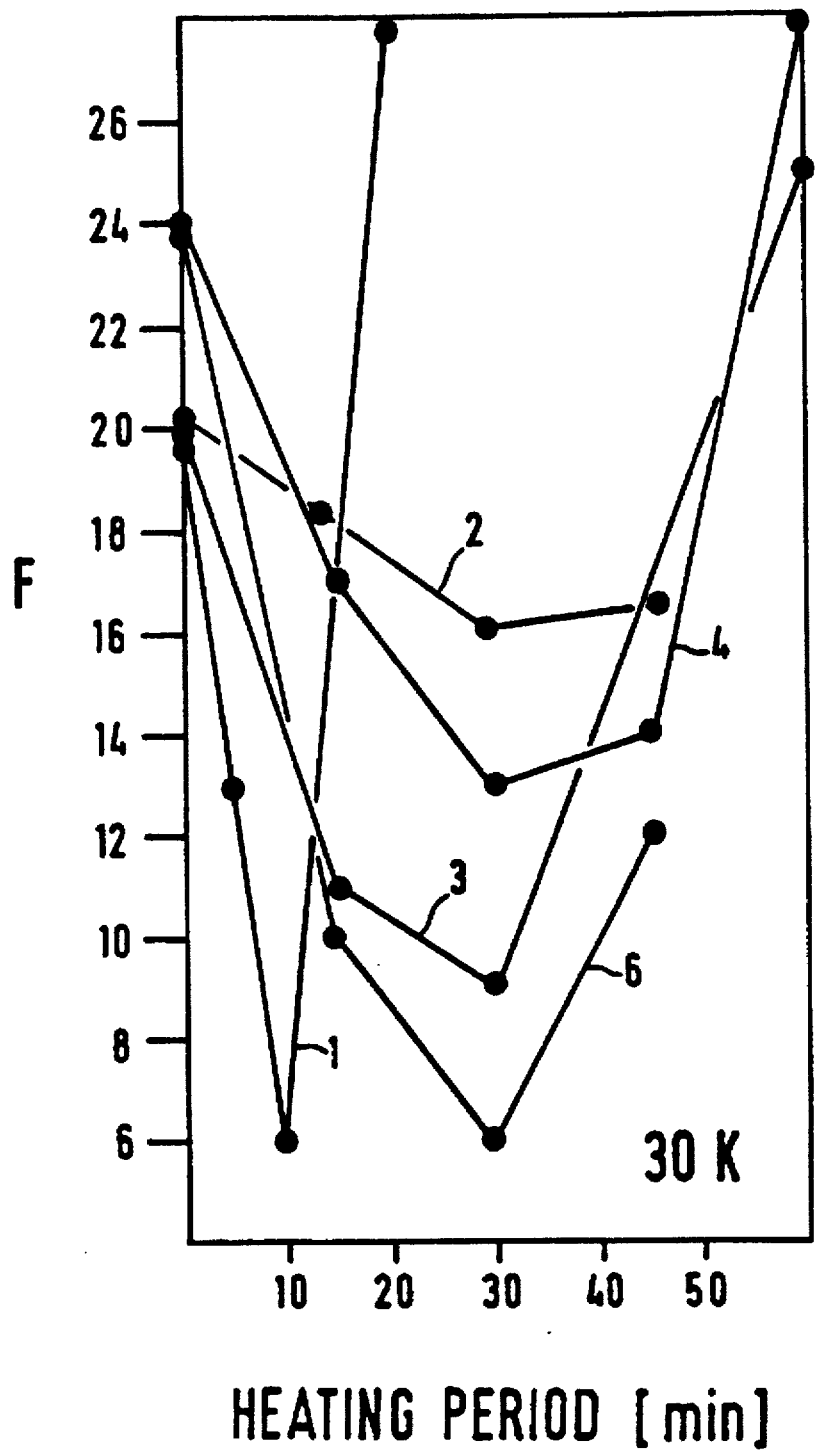
FIG. 2 is a plot of factor F, the quotient from the magnetization of a sample at 300 Gauss and the magnetization of this sample at 20,000 Gauss, against the annealing time of the last annealing of each sample.

FIG. 2 shows a plot of factor F (quotient from the magnetization of a sample at 300 Gauss and the magnetization of this sample at 20,000 Gauss) against the annealing time of the last annealing of each sample at the respective annealing temperature. The measurements were carried out at 30K. The series of samples each show a minimum of the factor F at 5 and 30 minutes, respectively. 1 means samples of batch 1, 2 means samples of batch 2, 3 means samples of batch 3, 4 means samples of batch 4 and 6 means samples of batch 6.

Figure 3:
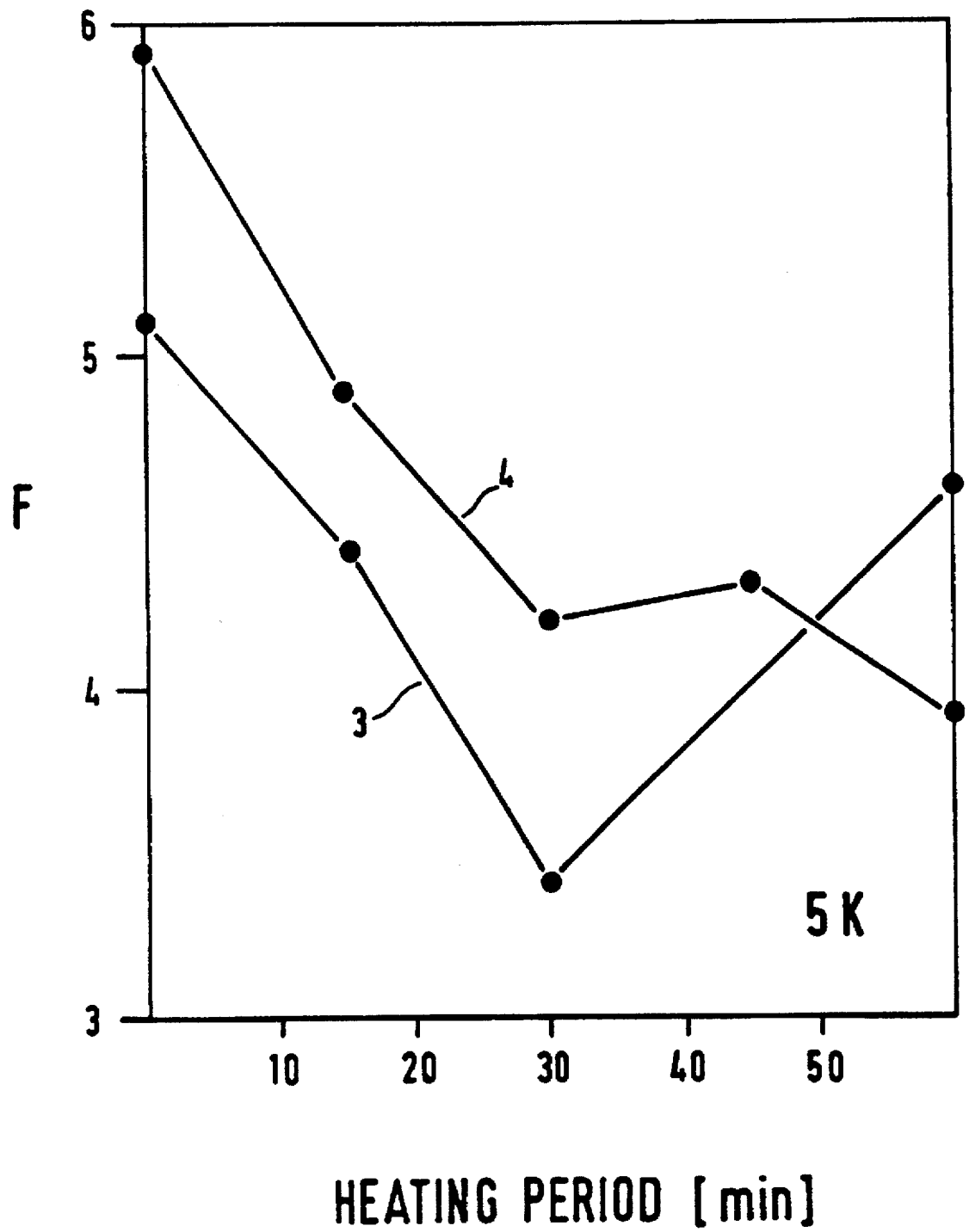
FIG. 3 is a plot of factor F against the annealing time of the last annealing of each sample.

FIG. 3 shows a plot of factor F (quotient from the magnetization of a sample at 300 Gauss and the magnetization of this sample at 20,000 Gauss) against the annealing time of the last annealing of each sample at the respective annealing temperature. The measurements were carried out at 5K. The series of samples did not show a minimum, or showed a far less pronounced minimum, of the factor F. 3 means samples of batch 3 and 4 means samples of batch 4.

FIG. 2, for the samples of batches 1, 2, 3, 4 and 6, demonstrates a minimum of the factor F at from 5 to 30 minutes. The fact that each of the minima of the factor F occurs at different annealing times is probably caused by the different Ca contents of the 2212 phase of the four batches giving rise to very different transformation temperatures and volume proportions to be formed of $Ca_2CuO_3$ and melt, in accordance with FIG. 1, so that the 2212 phase in the samples of batch 1 decomposes distinctly more rapidly at 875° C., and in this case considerably larger volume proportions of $Ca_2CuO_3$ and melt are formed, than in the samples of batches 3 and 4.

Based on the magnetization of the samples, the current carrying capacity $J_c$ of the samples can be calculated. $J_c$ of the samples in zero magnetic field is $10^3$ A/cm$^2$ (30 K.) and $10^4$ A/cm$^2$ (5 K.) respectively, at 300 Gauss is $10^2$ A/cm$^2$ (30 K.) and $10^4$ A/cm$^2$ (5 K.), and at 20,000 Gauss is $10^1$ A/cm$^2$ (30 K.) and $10^3$ A/cm$^2$ (5 K.), respectively.

Figure 4:
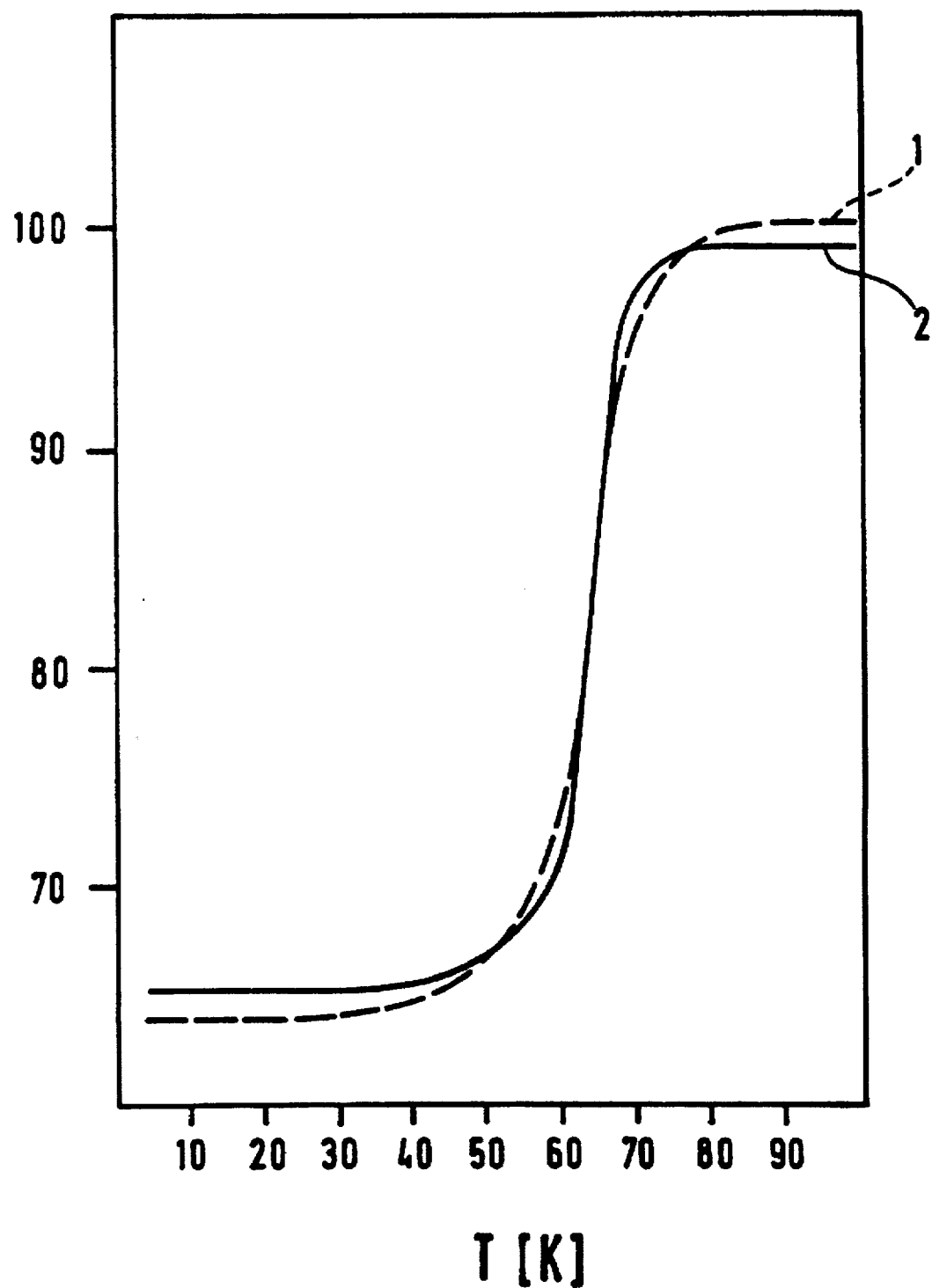
FIG. 4 is a graph of superconducting transition temperature for untreated and treated samples of batch 4.

FIG. 4 shows the superconducting transition temperature, determined with the aid of AC susceptibility measurements, of the untreated (1) and the sample annealed at 887° C. for 30 minutes (2) of batch 4. The superconducting transition temperature of both samples is identical, though at approximately 70K. it is very low. Annealing at 887° C. therefore does not affect the superconducting properties of the 2212 phase.

The fact that annealing the samples did not increase the superconducting transition temperature of the samples, and that the reduction of the factor F at 5 K. is not pronounced or is far less pronounced than at 30 K., shows that the formation of the precipitations in the samples causes an increase in the pinning force of the samples, as according to expectations the enhanced pinning of the samples can be detected only at temperatures above 5K. By virtue of secondary-phase precipitates being formed, the samples are therefore able to carry a higher current at the same external magnetic field.

Surprisingly and unexpectedly, said secondary-phase precipitates are formed at annealing times as short as less than 60 min, and the increase in the pinning force associated therewith can likewise be achieved within this short annealing time.

We claim:

1. A process for increasing the pinning force of a superconducting Bi-Sr-Ca-Cu-O ceramic molding, which comprises the steps of:
   producing a superconducting ceramic molding of substantially pure-phase 2212 Bi-Sr-Ca-Cu-O by one of a melt-cast and a powder metallurgy process; and
   heating the ceramic molding to a temperature of from 825° to 900° C. under a pure oxygen or an oxygen-containing gas for from 1 to 40 minutes to convert the substantially pure-phase 2212 Bi-Sr-Ca-Cu-O into a multi-phase system which, in addition to 2212 phase, contains at least one other phase which forms a secondary phase precipitate in the ceramic molding.

2. The process as claimed in claim 1 which comprises heating at from 880° to 895° C. for 30 minutes in air or in pure oxygen, if the Bi content of 2212 phase is 2.18 and the Sr/Ca ratio has values of from 1.7/1.3 to 1.9/1.1.

3. The process as claimed in claim 1 which comprises heating at from 885° to 895° C. for 30 minutes in pure oxygen, if the Bi content of 2212 phase is 2.18 and the Sr/Ca ratio has values of from 2.2/0.8 to 2.3/0.7.

4. The process as claimed in claim 1 which comprises heating at from 870° to 880° C. for 30 minutes in air, if the Bi content of the 2212 phase is 2.3 and the Sr/Ca ratio is 2/1.

5. A process as claimed in claim 1, wherein the ceramic molding is quenched after heating.

6. A process as claimed in claim 1, wherein the ceramic molding is quenched after heating at a quenching rate of about 100° K. per second from the heating temperature to about 873° K. and at a quenching rate of about 10° K. per second from about 873° K. to room temperature.

7. The process as claimed in claim 1, wherein the multi-phase system following heating comprises
   (1) 2212 phase and one or more of $Ca_2CuO_3$ and melt, or
   (2) 2212 phase and one or more of $(Sr,Ca)_{14}Cu_{24}O_{41-x}$, $(Sr,Ca)CuO_2$, $(Sr,Ca)_3Bi_2O_6$ and melt.

8. The process as claimed in claim 1, wherein the multi-phase system following heating comprises 2212 phase and one or more of $(Sr,Ca)_{14}Cu_{24}O_{41-x}$, $(Sr,Ca)CuO_2$, $(Sr,Ca)_3Bi_2O_6$ and melt.

9. The process as claimed in claim 1, wherein the multi-phase system following heating comprises 2212 phase and one or more of $Ca_2CuO_3$ and melt.

10. The process as claimed in claim 1, wherein the ceramic molding contains no secondary phases before heating.

11. The process as claimed in claim 1, wherein the heating temperature is from 880° to 895° C. for a composition having a Sr/Ca ratio of from 1.7/1/3 to 1.9/1.1, from 885° to 895° C. for a composition having a Sr/Ca ratio of from 2.2/0.8 to 2.3/0/7, and from 870° to 880° C. for a composition having a Sr/Ca ratio of from 2/1.

12. The process as claimed in claim 11, wherein the heating time is approximately 30 minutes.

13. The process as claimed in claim 12, wherein the heating is done in pure oxygen.

14. A process for increasing the pinning force of a superconducting Bi-Sr-Ca-Cu-O ceramic molding, which comprises the steps of:
   producing a superconducting ceramic molding of substantially pure-phase 2212 Bi-Sr-Ca-Cu-O by one of a melt-cast and a powder metallurgy process; and
   heating the ceramic molding to a temperature of from 825° to 900° C. under a pure oxygen or an oxygen-containing gas for less than 60 minutes to convert the substantially pure-phase 2212 Bi-Sr-Ca-Cu-O into a multi-phase system which, in addition to pure 2212 phase, contains at least one other phase which forms a secondary phase precipitate in the ceramic molding.

15. A process as claimed in claim 14, wherein the ceramic molding is quenched after heating.

16. A process as claimed in claim 14, wherein the ceramic molding is quenched after heating at a quenching rate of about 100° K. per second from the heating temperature to about 873° K. and at a quenching rate of about 10° K. per second from about 873° K. to room temperature.

17. A process for increasing the pinning force of a superconducting Bi-Sr-Ca-Cu-O ceramic molding, which comprises the steps of:
   producing a substantially pure-phase superconducting 2212 Bi-Sr-Ca-Cu-O material;
   producing a melt-casting or a pressed green body of said substantially pure-phase material;
   sintering the melt-casting or green body to produce a sintered substantially pure-phase 2212 Bi-Sr-Ca-Cu-O ceramic molding; and
   heating the sintered substantially pure-phase ceramic molding to a temperature of from 825° to 900° C. under a pure oxygen or an oxygen-containing gas for from 1 to 40 minutes to convert the substantially pure-phase 2212 Bi-Sr-Ca-Cu-O into a multi-phase system which, in addition to 2212 phase, contains at least one other phase which forms a secondary phase precipitate in the sintered substantially pure-phase 2212 Bi-Sr-Ca-Cu-O ceramic molding.

18. The process as claimed in claim 17, wherein the substantially pure-phase 2212 Bi-Sr-Ca-Cu-O material is produced by a melt-cast process.

19. The process as claimed in claim 17, wherein the substantially pure-phase 2212 Bi-Sr-Ca-Cu-O material is produced by a powder metallurgy process.

20. The process as claimed in claim 17, wherein the ceramic molding is a rod or wire.

* * * * *